(12) United States Patent
Rocznik (10) Patent No.: US 9,362,485 B2
(45) Date of Patent: Jun. 7, 2016

(54) VERTICAL HALL EFFECT SENSOR WITH OFFSET REDUCTION USING DEPLETION REGIONS

(71) Applicant: Robert Bosch GmbH, Stuttgart (DE)

(72) Inventor: Thomas Rocznik, Arnstadt (DE)

(73) Assignee: Robert Bosch GmbH, Stuttgart (DE)

( * ) Notice: Subject to any disclaimer, the term of this patent is extended or adjusted under 35 U.S.C. 154(b) by 91 days.

(21) Appl. No.: 14/200,526

(22) Filed: Mar. 7, 2014

(65) Prior Publication Data

US 2014/0266182 A1 Sep. 18, 2014

Related U.S. Application Data

(60) Provisional application No. 61/781,093, filed on Mar. 14, 2013.

(51) Int. Cl.
*G01R 33/07* (2006.01)
*H01L 43/04* (2006.01)
*H01L 43/06* (2006.01)

(52) U.S. Cl.
CPC .............. *H01L 43/04* (2013.01); *G01R 33/077* (2013.01); *H01L 43/065* (2013.01)

(58) Field of Classification Search
CPC ...... G01R 33/077; H01L 43/04; H01L 43/065
USPC ................................ 324/251, 207.2; 257/427
See application file for complete search history.

(56) References Cited

U.S. PATENT DOCUMENTS

| | | | |
|---|---|---|---|
| 3,448,353 A * | 6/1969 | Corak | ............ H01L 29/00 148/33 |
| 6,542,068 B1 | 4/2003 | Drapp et al. | |
| 8,164,149 B2 * | 4/2012 | Schott | .................. G01R 33/07 257/426 |
| 2003/0164530 A1 | 9/2003 | Robert et al. | |
| 2006/0011999 A1 * | 1/2006 | Schott | .................. G01R 33/07 257/421 |
| 2010/0145657 A1 | 6/2010 | Kavusi et al. | |
| 2010/0219810 A1 | 9/2010 | Rocznik et al. | |
| 2010/0219821 A1 | 9/2010 | Rocznik et al. | |
| 2013/0015847 A1 * | 1/2013 | Kaufmann et al. | ........... 324/225 |
| 2013/0021027 A1 * | 1/2013 | Ausserlechner | .............. 324/251 |
| 2013/0342195 A1 * | 12/2013 | Ausserlechner | ...... H01L 43/065 324/251 |

OTHER PUBLICATIONS

International Search Report and Written Opinion corresponding to PCT Application No. PCT/US2014/023201, mailed Jul. 18, 2014 (14 pages).

* cited by examiner

*Primary Examiner* — Jay Patidar
(74) *Attorney, Agent, or Firm* — Maginot Moore & Beck LLP (57) ABSTRACT

A vertical Hall Effect sensor assembly in one embodiment includes a first sensor with a first doped substrate, a first doped well, the first doped well having a doping opposite to the first doped substrate, a first endmost inner contact accessible at a first surface of the first sensor and located at a first end portion of the first doped well, a first intermediate inner contact accessible at the first surface and located between the first endmost inner contact and a second end portion of the first doped well, and a first electrode positioned on the first surface immediately adjacent to the first endmost inner contact and the first intermediate inner contact, the first electrode electrically isolated from the first doped well, and a first voltage source operably connected to the first electrode.

13 Claims, 10 Drawing Sheets

VERTICAL HALL EFFECT SENSOR WITH OFFSET REDUCTION USING DEPLETION REGIONS

This application claims the benefit of U.S. Provisional Application No. 61/781,093 filed Mar. 14, 2013, the entirety of which is incorporated herein by reference.

FIELD

This disclosure relates to sensor devices and more particularly to magnetic field sensor devices.

BACKGROUND

The integration of magnetic field sensors in a wide range of applications has created a large market and increased the demand for smaller, more accurate and low cost magnetic field sensors. Standard CMOS technology is one of the most cost efficient approaches to integrate magnetic field sensors into various applications. The ability to sense the magnetic field in all three axes enables an even larger number of applications.

A common magnetic field sensor is a device configured to sense the magnetic field parallel to the chip surface. These sensors are referred to as "vertical Hall Effect sensors". This type sensor was invented in 1985 and have been studied extensively ever since.

Figure 1:
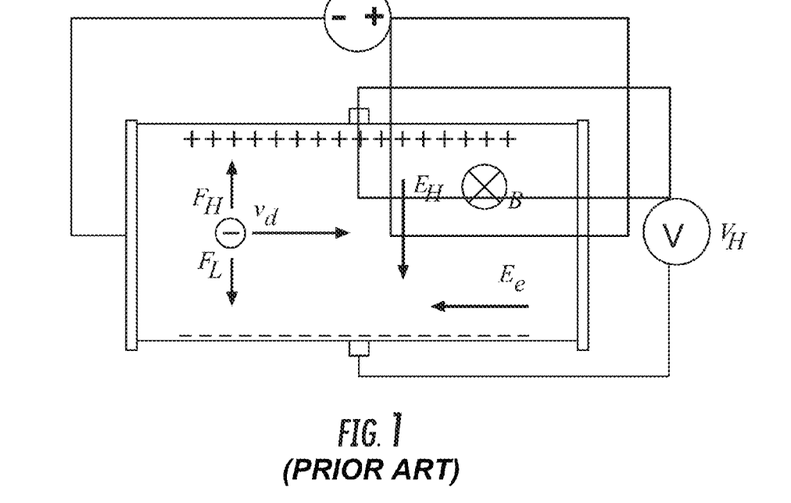
FIG. 1 depicts a standard Hall Effect sensor, static force due to charge separation $F_H$, Lorentz Force $F_L$, charge velocity $v_d$, Hall electrical field $E_H$, magnetic induction B, electrical field $E_e$, and Hall voltage $V_H$.
Figure 2:
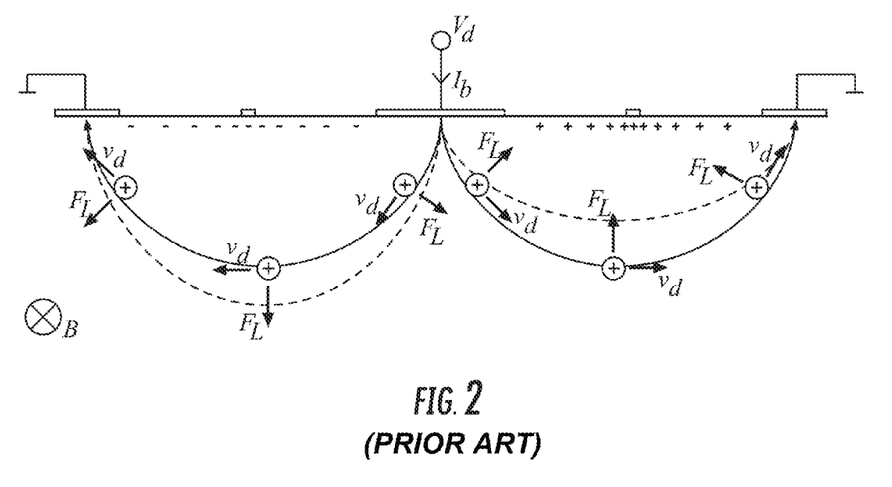
FIG. 2 depicts five vertical Hall Effect sensors and the Lorentz Force $F_L$, charge velocity $v_d$, magnetic induction B, device voltage $V_d$, and device current $I_b$.

The Hall Effect makes use of the Lorentz Force which deflects moving charges in the presence of a magnetic field which is perpendicular to the current flow through the sensor. The deflection causes a charge separation which causes a Hall electrical field. This electrical field acts on the charge in the opposite direction in regard to the Lorentz Force. Both forces balance each other and create a potential difference perpendicular to the direction of current flow. The potential difference can be measured as a Hall voltage and varies in a linear relationship with the magnetic field for small values. FIG. 1 schematically represents this mechanism for a standard Hall Effect sensor. The vertical Hall Effect sensor works on the same principle. In FIG. 2 the current flow of a standard vertical Hall Effect device and the acting forces under the influence of a magnetic field are shown.

Several different vertical Hall Effect devices have been published in the past but all work based upon the same principle and suffer more or less from the same draw backs. One big disadvantage of these known sensors, in relation to conventional Hall Effect sensors, is the high offset. Offset is the description of an output signal which is present without an input signal. This unwanted signal usually follows a random distribution over different sensor samples and exhibits a non-linear relationship with both temperature and input voltage.

There have been two main strategies used in an attempt to reduce the offset of conventional and vertical Hall Effect sensors. One strategy is referred to as "sensor combination". In sensor combination, systematic offsets caused by large scale process tolerances and design flaws of the sensor are addressed by combining four sensors in parallel. The device current in each device flows in a different direction in respect to the crystal structure of the silicon grid. This compensates for stress inducted offset for lateral sensors. Applying this method to vertical sensors reduces the offset caused by design and process variation of the well depth of the active region.

A second approach is referred to as the "spinning current method". The spinning current method can be applied in addition to the sensor combination and reduces the influence of flicker noise. The spinning current method also reduces the offset caused by symmetric differences of each sensor within the sensor combination.

Figure 3:
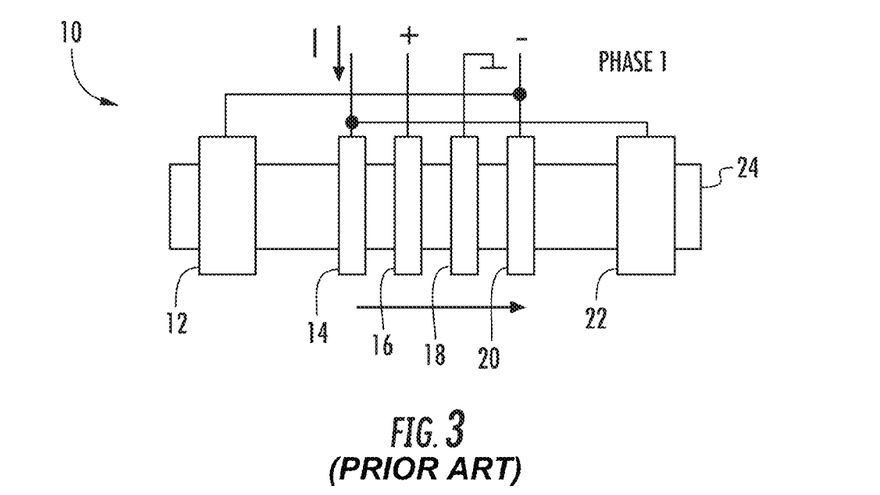
FIG. 3 depicts an example of a vertical Hall Effect architecture with six contacts and two shortcuts.

A sensor architecture where 6 n+ doped contacts are placed on an n doped well which is placed in a p doped substrate is used as example and shown FIG. 3. In FIG. 3, the sensor 10 includes six 6 n+ doped contacts 12, 14, 16, 18, 20 and 22 on an n doped well 24. The n doped well 24 is located within a p doped substrate (not shown in FIG. 3). It can be seen that the outer contacts 12 and 22 are connected to the second contact on the opposite side of the device (contacts 14 and 20, respectively). Four of these sensors 10 are connected as described above as a single sensor assembly. The problems identified herein are not limited to this kind of sensor architecture and will affect all CMOS implemented vertical Hall Effect sensors which are designed with the same strategy.

Figure 4:
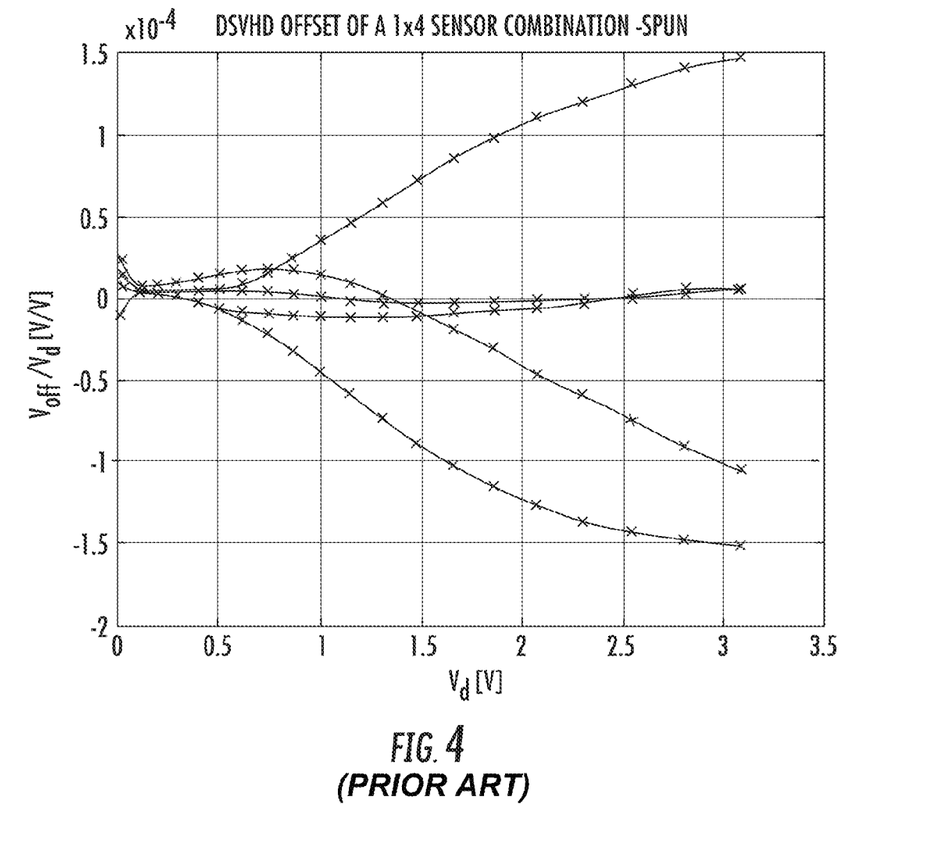
FIG. 4 depicts measurement of offsets of four different dies off the same sensor design after device combination and current spinning were applied at 25° C.

The approaches described above work very well for lateral sensors but fail under certain condition for vertical Hall Effect sensors. Several measurement examples are given in FIG. 4 where both techniques were applied. In FIG. 4 five identical sensor combinations were measured for offset errors. Each of these sensor combinations was on a different die. The maximum offset of one of the sensors was 150 uV/V which is equal to a magnetic field of about 5 mT at a common sensitivity of 30 mV/VT at 25° C.

Figure 5:
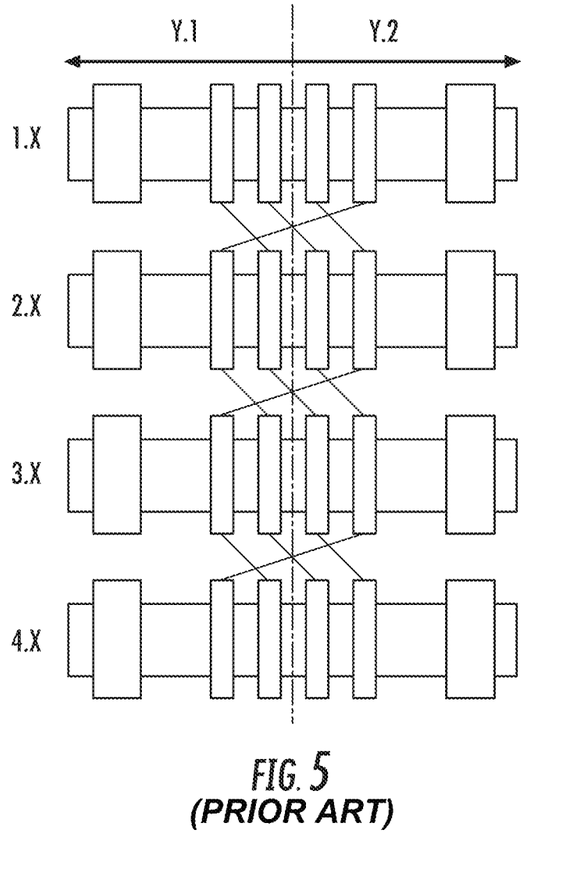
FIG. 5 depicts a schematic example of a device combination wherein each sensor has additional short circuits as shown in FIG. 3 which are not shown for simplicity.

FIG. 5 shows an exemplary configuration of four sensors like the sensor 10. For simplicity the short circuits of the outer contacts to the inner contact as shown in FIG. 3 of each single sensor are not displayed, but taken in to account. In FIG. 5, an axis of symmetry divides the sensors into sides Y.1 and Y.2. The two methods described above work well as long as there is no asymmetric sensor in this combination, consequently, Y.1=Y.2.

Figure 6:
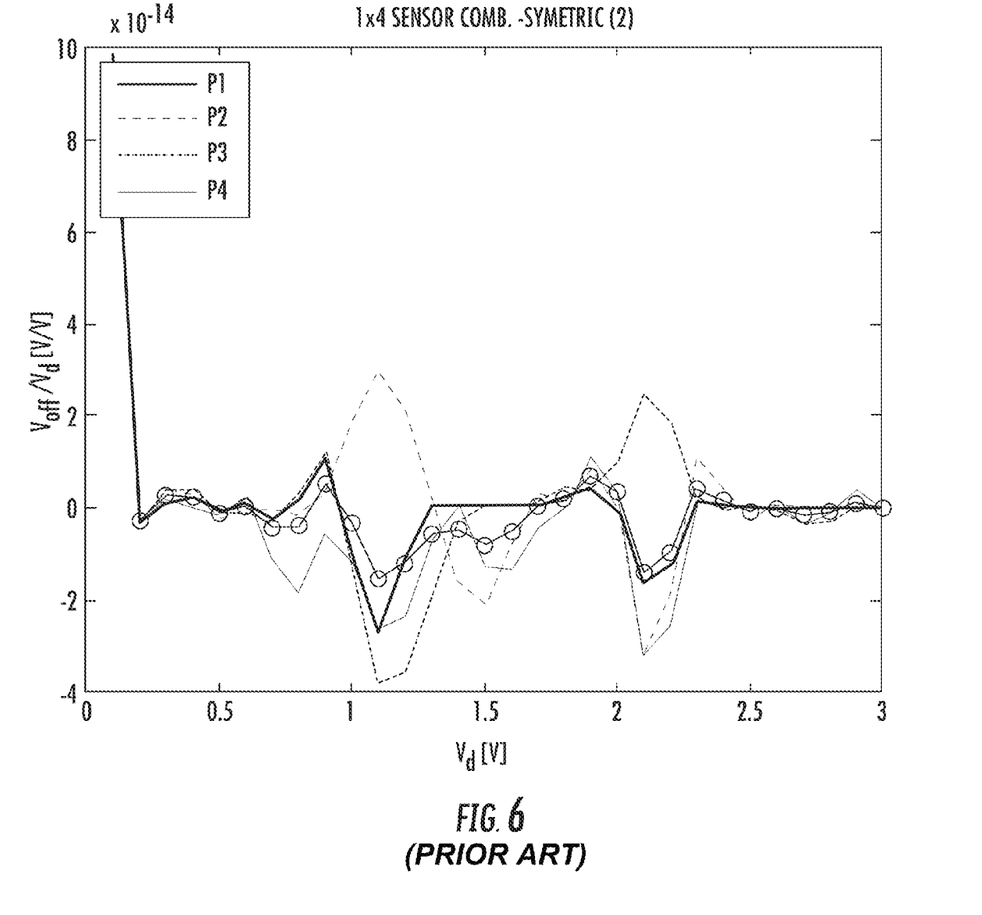
FIG. 6 depicts an FEM simulation result of four sensors in sensor combination where all sensors are identical. The different phases of the spinning current method are displayed in red, green, blue and magenta. The average of all four phases is pictures in black.

FIG. 6 shows a FEM simulation of a perfect scenario where all four sensors are identical and symmetrical. FIG. 6 shows that the device combination in this case cancels the offset errors perfectly since each single phase of the spinning current shows less than 400 pV/V.

In instances where all four sensors are symmetrical but different from each other, the device combination stops working and each single phase of the spinning current method shows offsets. However, the average of these phases cancels the offset perfectly and thus the spinning current method works for this case.

Figure 7:
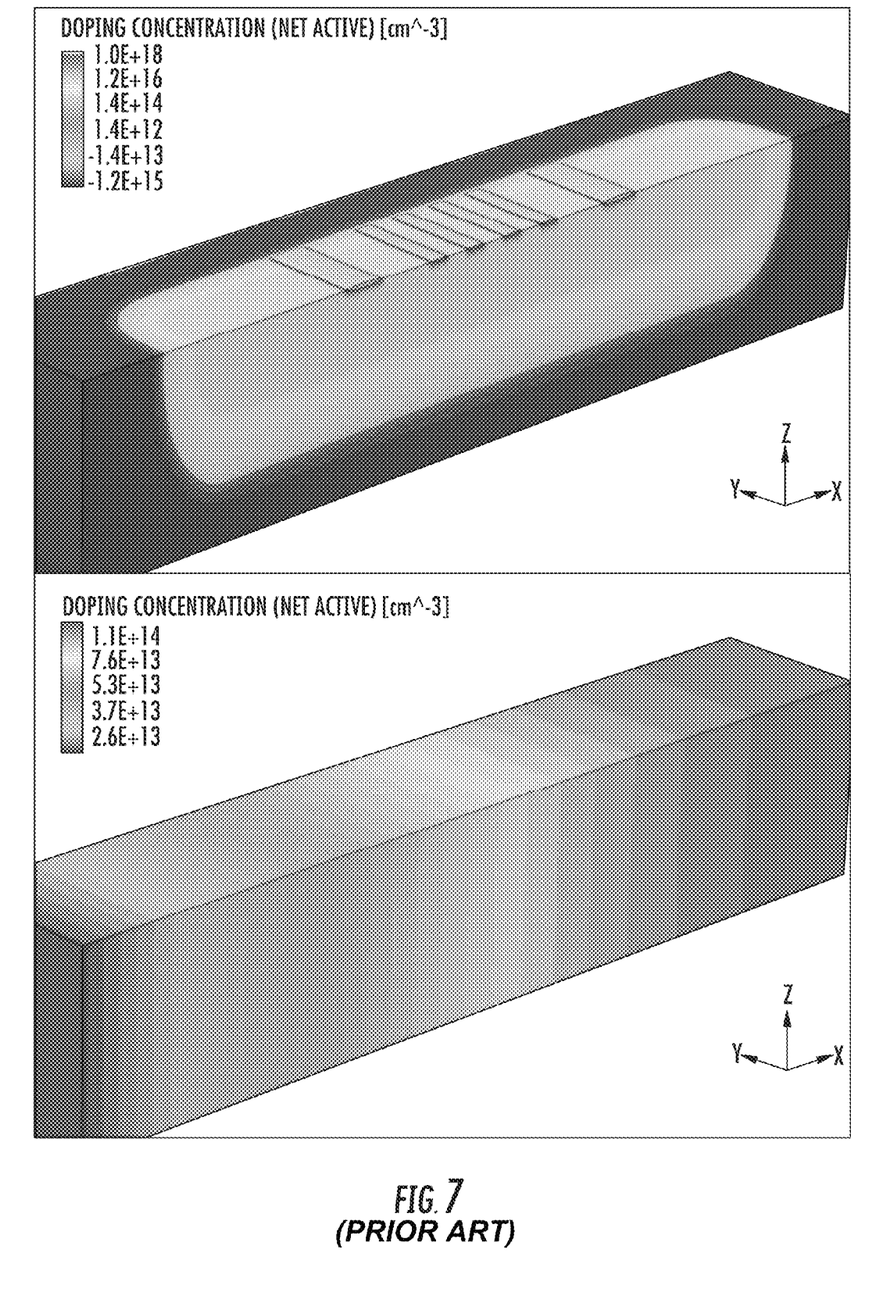
FIG. 7 depicts the asymmetry in vertical Hall Effect sensors as simulated by overlaying the doping profile of a symmetric sensor (left) with a doping gradient (right) less than 1%.
Figure 8:
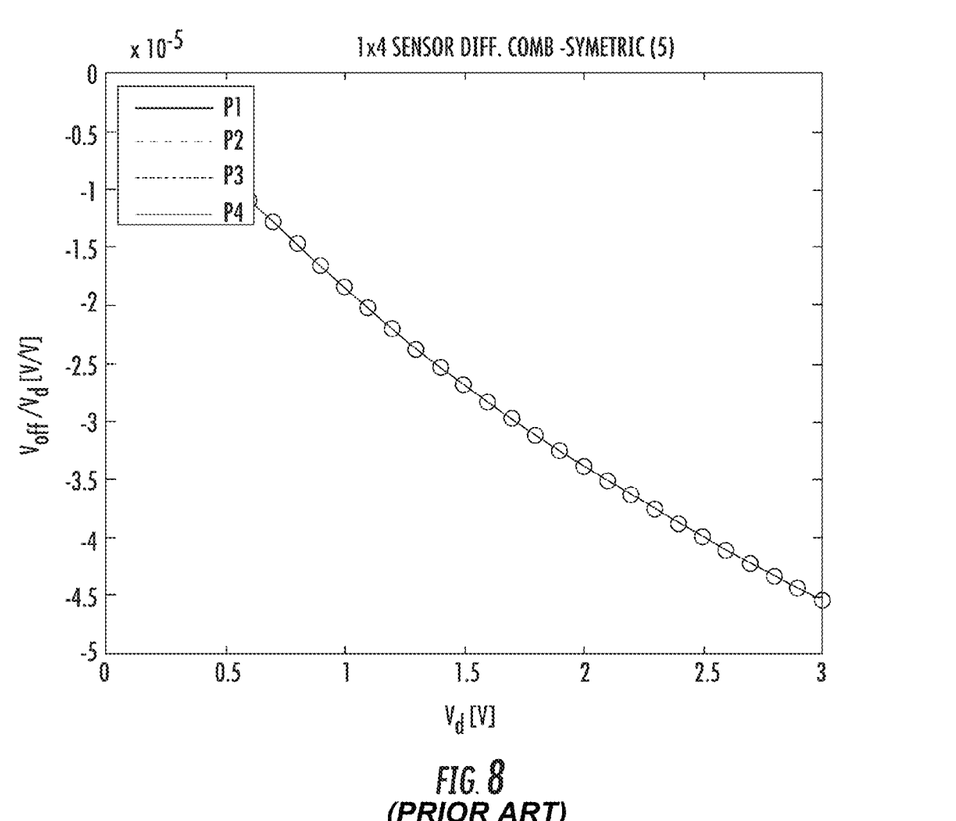
FIG. 8 depicts the result of an FEM simulation where four sensors in combination are alike but have a gradient along the current direction. The different phases of the spinning current method are displayed in red, green, blue and magenta. The average of all four phases is depicted in black.

The spinning current method stops working, however, in configurations with four sensors which are alike but not symmetrical. In one simulated case the asymmetry was generated by a doping gradient in current direction as shown in FIG. 7. In this scenario all four phases show the same offset and the mean of the four phases, which represents the spinning current output, is shown in FIG. 8.

Figure 9:
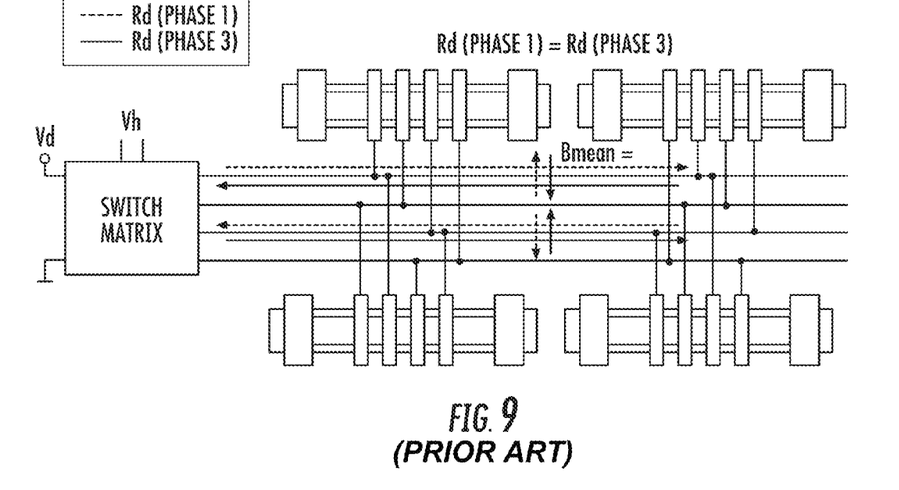
FIG. 9 depicts a device combination with its current supply in a balanced condition.

A second source of offset is due to self-generated parasitic magnetic fields. If a single sensor or a sensor combination is in perfect condition the input resistance in each phase will be equal. In this case the amount of current which goes towards the device in phase one is the same as the amount in phase three but in the opposite direction. The same is true for phases two and four. Each of these currents generates a magnetic field but since the amounts of two currents are always equal the mean magnetic field after four phases is 0 T. This scenario is depicted in FIG. 9.

Figure 10:
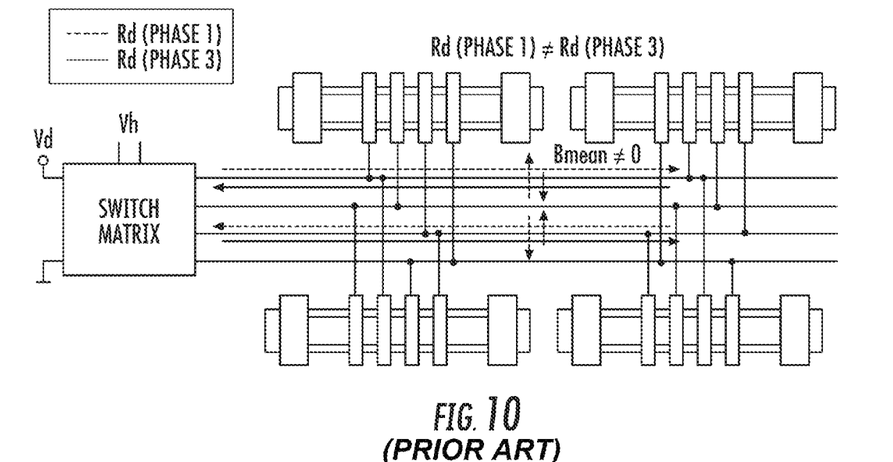
FIG. 10 depicts a device combination with its current supply in an unbalanced condition.

If for some reason the input resistance is not equal in phases one/three and two/four there will be a residual magnetic field after averaging the different phases of the spinning current method. FIG. 10 shows this scenario. This mismatch in current will lead to a residual offset of the sensor system.

What is needed therefore is a system and method which provides offset reduction for vertical Hall Effect sensors if a gradient or any other disturbance along the current flow direction within the one or more sensors exists.

SUMMARY

A vertical Hall Effect sensor assembly in one embodiment includes a first sensor with a first doped substrate, a first doped well, the first doped well having a doping opposite to the first doped substrate, a first endmost inner contact accessible at a first surface of the first sensor and located at a first end portion of the first doped well, a first intermediate inner contact accessible at the first surface and located between the first endmost inner contact and a second end portion of the first doped well, and a first electrode positioned on the first surface immediately adjacent to the first endmost inner contact and the first intermediate inner contact, the first electrode electrically isolated from the first doped well, and a first voltage source operably connected to the first electrode.

In another embodiment, a method of operating a vertical Hall Effect sensor assembly includes applying a first current to a first endmost inner contact accessible at a first surface of a first sensor and located at a first end portion of a first doped well in a first doped substrate of first sensor, the first doped well having a doping opposite to the first doped substrate, obtaining a first Hall Effect voltage using a first intermediate inner contact accessible at the first surface and located between the first endmost inner contact and a second end portion of the first doped well while applying the first current to the first endmost inner contact, and applying a first voltage to a first electrode positioned on the first surface immediately adjacent to the first endmost inner contact and the first intermediate inner contact, the first electrode electrically isolated from the first doped well, while applying the first current to the first endmost inner contact and obtaining the first Hall Effect voltage.

DESCRIPTION

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art to which this disclosure pertains.

In accordance with principles of the disclosure, disturbances created by gradient or any other disturbance along the current flow direction within one or more sensors are counteracted by creating a counter gradient within the device by controlling the current flow in the active region of each sensor. This is accomplished in one embodiment by using electrodes in-between the contacts which are insulated from the active region and which create a depletion region underneath the electrode.

Figure 11:
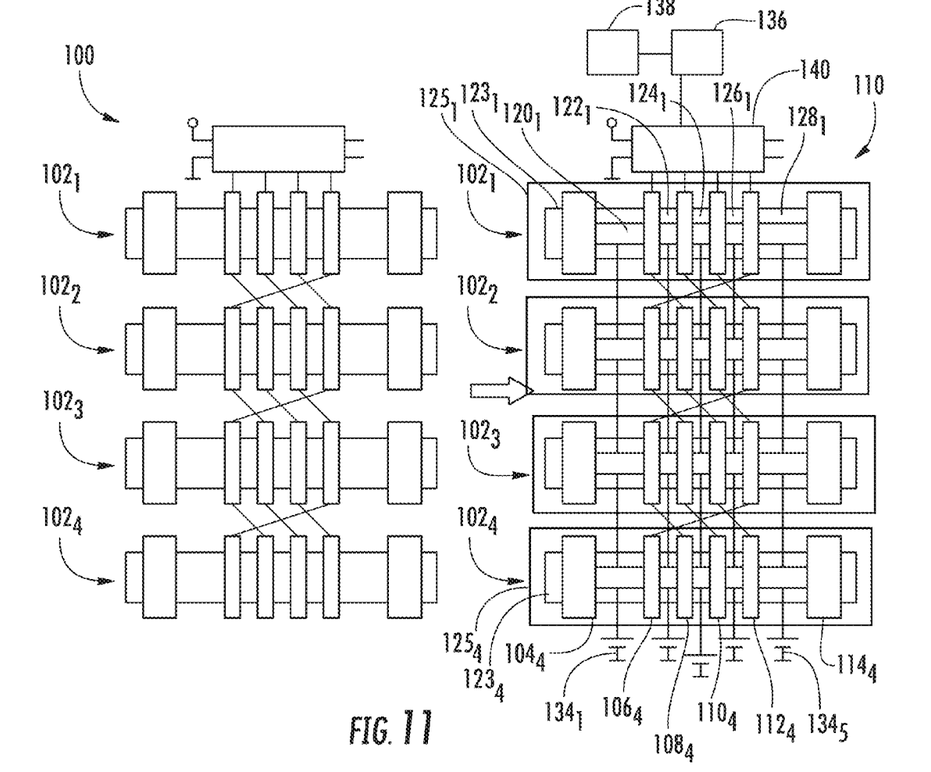
FIG. 11 depicts a device combination with additional electrodes in-between contacts.

By way of example, FIG. 11 depicts a sensor array 100 which includes four sensors $102_{1-4}$ which are connected in the manner described above with respect to FIG. 3. The sensor array 110, also includes the sensors $102_{1-4}$. The array 110, however, is configured to create depletion regions.

Specifically, the sensors $102_{1-4}$ each include respective contacts $104_{1-4}$, $106_{1-4}$, $108_{1-4}$, $110_{1-4}$, $112_{1-4}$, and $114_{1-4}$. The contacts $106_{1-4}$, $108_{1-4}$, $110_{1-4}$, $112_{14}$ are referred to herein as "inner" contacts while the contacts $104_{1-4}$ and $114_{1-4}$ are "outer" contacts. The outer contacts $104_{1-4}$ and $114_{1-4}$ are shorted to inner contacts like the sensor in FIG. 3.

Figure 12:
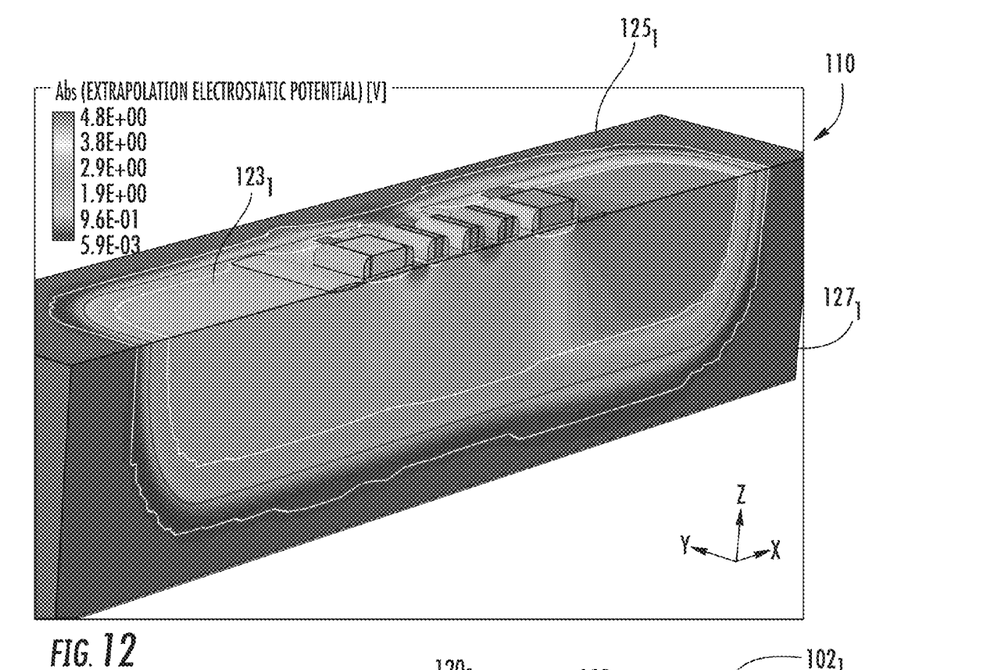
FIG. 12 depicts a simulation of a vertical Hall Effect sensor with electrodes insulated from the active region (well)

Between each pair of immediately adjacent contacts is located a respective electrode $120_{1-4}$, $122_{1-4}$, $124_{1-4}$, $126_{1-4}$, and $128_{1-4}$. Each of the electrodes is insulated from the active region of the sensor. For example, FIG. 12 depicts the electrodes $120_1$, $122_1$, $124_1$, $126_1$, and $128_1$ positioned between the contacts $104_1$, $106_1$, $108_1$, $110_1$, $112_1$, and $114_1$ which are located in a doped well $123_1$ which extends along a surface $125_1$ of a substrate $127_1$ wherein the doped well has a doping opposite to the doped substrate. As shown more clearly in FIG. 13, each electrode $120_1$, $122_1$, $124_1$, $126_1$, and $128_1$ is electrically isolated from the active region 130 of the sensor $102_1$ by an insulator portion 132.

A voltage $134_{1-5}$ is then applied across each corresponding electrode for each sensor. Thus, a voltage $134_1$ is applied across the electrodes $120_1$, $120_2$, $120_3$, and $120_4$. Another voltage $134_5$ is applied across the electrodes $128_1$, $128_2$, $128_3$, and $128_4$, and so on. In another embodiment, an electrode specific voltage is applied to each individual electrode. The depth of the depletion region depends on the applied voltage at the respective electrodes, the potential of the active region below and the thickness of the insulator. The application of the voltage(s) in some embodiments is controlled by a processor 136 executing program instructions stored in a memory 138. The same processor 136 in some embodiments is used to control the switch matrix 140 which can be used to provide a spinning current through the sensor assembly.

In operation, the processor 136 controls the application of the desired voltage to the electrodes $120_{1\text{-}4}$, $122_{1\text{-}4}$, $124_{1\text{-}4}$, $126_{1\text{-}4}$, and $128_{1\text{-}4}$. The switch matrix 140 is also controlled by the processor 136 to apply a current into and out of two of the inner contacts $106_{1\text{-}4}$, $108_{1\text{-}4}$, $110_{1\text{-}4}$, $112_{1\text{-}4}$, while a voltage reading is obtained from the other two of the remaining inner contacts $106_{1\text{-}4}$, $108_{1\text{-}4}$, $110_{1\text{-}4}$, $112_{1\text{-}4}$. For example, referring to the sensor $102_1$, current may be directed into the inner contact $106_1$ and received from the inner contact $110_1$ while a voltage is obtained across the inner contacts $108_1$ and $112_1$. To obtain a spinning current, the switch matrix is then sequenced through other pairings so as to introduce current into the inner contact $108_1$ and received from the inner contact $112_1$ while a voltage is obtained across the inner contacts $106_1$ and $110_1$.

As the above process is occurring in the sensor $102_1$, current is also applied to the sensors $102_{2\text{-}4}$, as indicated by the interconnections in FIG. 11, and voltages obtained, in a similar manner. The processor 136 processes the voltages in a desired manner to provide a desired output.

Figure 13:
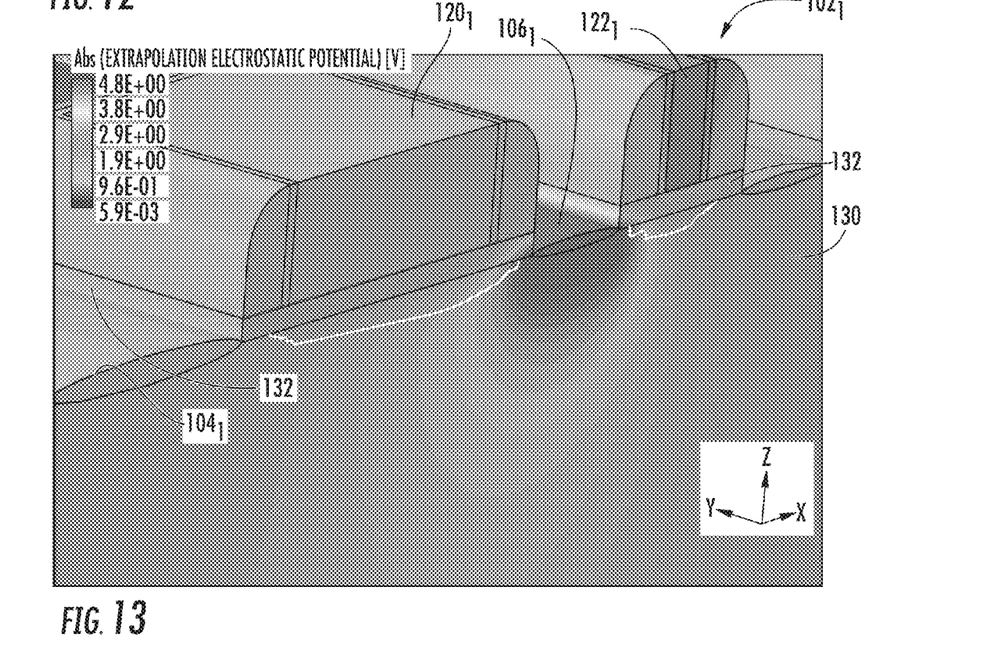
FIG. 13 depicts an exemplary configuration of electrode implementation.

While a particular embodiment has been depicted in FIGS. 11-13, the sensor architecture shown is used as an example and the implementation of these electrodes can be applied to any other vertical Hall Effect sensor.

Figure 14:
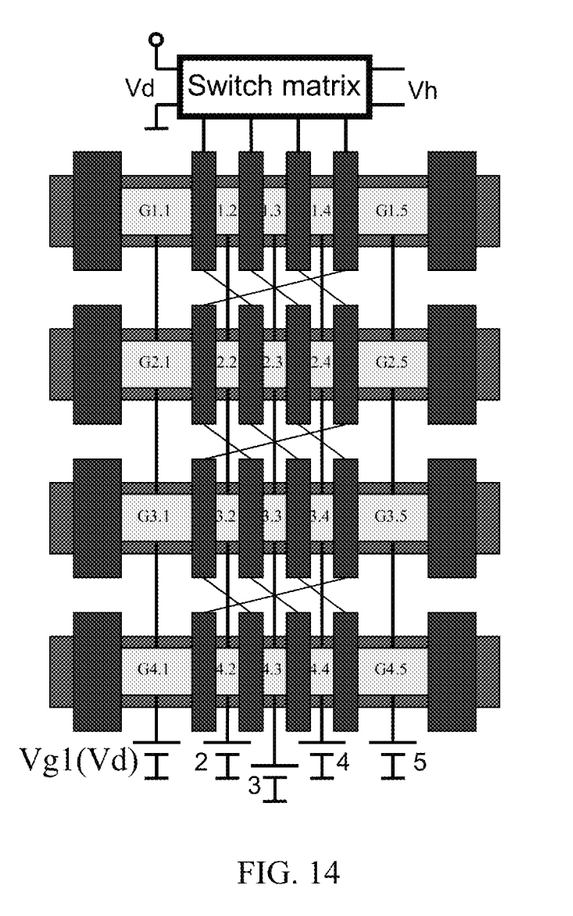
FIG. 14 depicts an exemplary configuration of connecting the electrodes to each other.

The gates Gn.m shown in FIG. 14 in different embodiments are controlled by the processor 136 separately or connected to each other. In embodiments wherein the electrodes are connected to each other it is still possible to introduce a gradient along the current direction within the sensors with the processor 136. An example of these connections is given in FIG. 14, but other configurations are possible.

The voltage applied to the electrodes in FIG. 14 can be determined by a mapping procedure stored in the memory 138 which includes ramping the device voltage and finding the right voltage combination on each electrode. In addition, this mapping procedure can be done at different temperatures.

Figure 15:
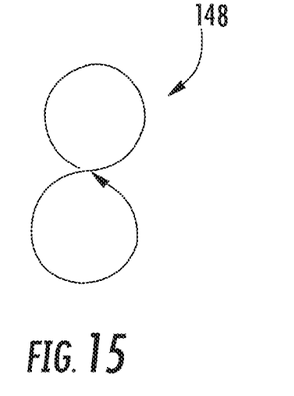
FIG. 15 depicts a movement in the shape of a "Figure 8".

For embodiments wherein the sensor is used in a mobile application, the offset can be canceled with a certain movement. For example, a "figure 8" as indicated by the arrow 148 in FIG. 15 can be used in order to determine the offset of the sensor and compensate for it. This can be used to create a database in the memory 138 over time at different temperatures. This approach reduces the need for the user to mimic all of the movements during an initial calibration period and reduces the requirements for calibration immediately after fabrication.

In addition, the device voltage can serve as a reference for the voltages of the electrodes in order to compensate temperature variation since these sensors are commonly supplied with a constant current.

The mapping procedure disclosed herein addresses the problem of self-generated offsets due to residual magnetic field caused by input resistance mismatch. The symmetric use of the electrodes provides a change of each individual sensor's input resistance and matches the resistances in each single phase of the spinning current method to account for self-generated parasitic magnetic fields. In this case the residual magnetic field due to input current will be 0 T.

The voltages at the electrodes can be determined using the processor 136 by measuring the input current and the applied voltage in each single phase. It is important to use the electrodes in a symmetric manner in order to avoid introducing an offset. In the example shown in FIG. 14, the electrodes marked with Gn.3 are used since these are symmetrically placed. However, any other symmetric pair of electrodes can be used.

The electrodes can also be used to provide feedback to the sensor. For example an electronic circuit with a control loop including the sensor can adjust the electrode voltages in order to keep the output voltage of the sensor always at 0V and the output signal is the voltage provided to the electrodes. This limits the dynamic range of the frontend electronics and a simpler amplifier architecture can be used since the signal range is very small and linearity of the frontend is not as important.

In addition, the properties of the sensor such as sensitivity, impedance and linearity can be modulated with symmetric use of the electrodes. This enables the differentiation between offset and signal in the frequency domain if the offset is not influenced by the symmetric use of the electrodes.

Since the sensor properties can be changed with the electrodes, a self-test can be performed using the processor 136 in order to determine the functionality of the sensor. With the knowledge of the influence of the electrodes over the sensor's properties the processor 136 can determine if the sensor is working proper by introducing properties changes and comparing the results to the expected outcome.

Sensor assemblies configured in the manner described herein can be used in all applications where it is desired to measure the magnetic field in all three directions or where the vector of the magnetic field is of interest. The disclosed sensor assemblies are thus useful for scenarios directed toward angle measurements or nonlinear distance measurements. A typical application is a compass which determines the direction of the magnetic field produced by the earth. Other applications include steering wheel angle or brake pedal travel.

In accordance with the disclosure, a vertical Hall Effect sensor using a doped well implanted in an opposite doped substrate with highly doped contacts accessible at the surface of the sensor has at least one electrode insulated from the well between the contacts. In some embodiments, the electrode voltage has a constant voltage source or a voltage supply with a reference to the device voltage. The sensor in some embodiments incorporates a spinning current method.

In one embodiment, two or more sensors are included. The contacts for the sensors are connected in a way that the contacts of the next sensor are shifted by 1 to the right or left in regard to the previous sensor (or sensor combination). The electrodes between the contacts in some embodiments are connected in parallel to the corresponding electrode on the next sensor. In other embodiments, the electrodes are controlled individually.

In one embodiment, the sensor(s) is operated by applying a voltage gradient throughout the sensor with the electrodes in order to reduce offset. The offset can be due to doping, stress, temperature or other gradients along the current flow direction.

In one embodiment the sensor(s) is operated by applying a symmetric voltage throughout each sensor with the electrodes in order to achieve the same input resistance in each phase of the spinning current method. The voltage applied to the electrodes can be different for each sensor.

In one embodiment the voltage at the electrode(s), particularly in a mobile application, is determined using available offset. During operation, a database of electrode voltages at different circumstances is generated in order to reduce the user's interaction in offset calibration.

In one embodiment, the sensor(s) are operated by applying a voltage gradient throughout the sensor with the electrodes through feedback electronics in order to keep the output voltage of the sensors at 0V. In these embodiments, the feedback voltage is the signal output.

In one embodiment, the sensor properties are modulated using the electrode voltages so as to separate the offset from the signal in the frequency domain for self-test purposes.

The above described embodiments in various embodiments are combined for a particular application.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A vertical Hall Effect sensor assembly comprising:
   a first sensor including
     a first doped substrate,
     a first doped well in the first doped substrate, the first doped well extending along a first surface of the first doped substrate and having a doping opposite to the first doped substrate,
     a first endmost inner contact accessible at the first surface of the first sensor and located at a first end portion of the first doped well,
     a first intermediate inner contact accessible at the first surface and located between the first endmost inner contact and a second end portion of the first doped well wherein the second end portion is opposite the first end portion, and
     a first electrode positioned on the first surface immediately adjacent to the first endmost inner contact and the first intermediate inner contact, the first electrode electrically isolated from the first doped well;
   a first voltage source operably connected to the first electrode;
   a second sensor, the second sensor including
     a second doped substrate,
     a second doped well in the second doped substrate, the second doped well extending along a second surface of the second doped substrate and having a doping opposite to the second doped substrate,
     a second endmost inner contact accessible at the second surface of the second sensor and located at a third end portion of the second doped well,
     a second intermediate inner contact accessible at the second surface and located between the second endmost inner contact and a fourth end portion of the second doped well,
     a second electrode positioned on the second surface immediately adjacent to the second endmost inner contact and the second intermediate inner contact, the second electrode electrically isolated from the second doped well, and
     a third intermediate inner contact accessible at the second surface and located between the second intermediate inner contact and the fourth end portion of the second doped well;
   a third electrode positioned on the second surface immediately adjacent to the second intermediate inner contact and the third intermediate inner contact, the third electrode electrically isolated from the second doped well; and
   a third voltage source operably connected to the third electrode, the third voltage source providing a voltage amplitude to the third electrode different from the voltage amplitude provided by the first voltage source to the first electrode.

2. The vertical Hall Effect sensor assembly of claim 1, wherein:
   the first voltage source is operably connected to the second electrode.

3. The vertical Hall Effect sensor assembly of claim 1, further comprising:
   a second voltage source operably connected to the second electrode, the second voltage source providing a voltage amplitude to the second electrode different from the voltage amplitude provided by the first voltage source to the first electrode.

4. The vertical Hall Effect sensor assembly of claim 1, further comprising:
   a memory having program instructions stored therein; and
   a processor operably connected to the memory and to the first voltage source and the third voltage source, the processor configured to execute the program instructions to conduct a self-test by
     controlling the first voltage source and the third voltage source to modulate sensor properties so as to separate an offset from a signal in the frequency domain.

5. The vertical Hall Effect sensor assembly of claim 1, further comprising:
   a memory having program instructions stored therein; and
   a processor operably connected to the memory and to the first voltage source and the third voltage source, the processor configured to execute the program instructions to
   maintain a first output voltage of the first sensor and a second output of the second sensor at 0 V during sensing by applying a first voltage gradient throughout the first sensor and a second voltage gradient throughout the second sensor.

6. The vertical Hall Effect sensor assembly of claim 1, further comprising:
   a memory having program instructions stored therein; and
   a processor operably connected to the memory and to the first voltage source and the third voltage source, the processor configured to execute the program instructions to
     obtain first and second sensor inputs from the first and second sensors as the vertical Hall Effect sensor assembly is moved through a "figure 8" pattern,
     determine a first sensor offset associated with the first sensor based upon the obtained first and second sensor inputs,
     determine a second sensor offset associated with the second sensor based upon the obtained first and second sensor inputs, and
     control the first voltage source and the third voltage source to compensate for the first sensor offset and the second sensor offset.

7. The vertical Hall Effect sensor assembly of claim 1, further comprising:
   an insulator portion positioned between the first electrode and the first doped well, the insulator portion electrically isolating the first electrode from the first doped well.

8. A method of operating a vertical Hall Effect sensor assembly, comprising:
   applying a first current to a first endmost inner contact accessible at a first surface of a first sensor and located at a first end portion of a first doped well in a first doped substrate of a first sensor, the first doped well extending along the first surface of the first doped substrate and having a doping opposite to the first doped substrate;

obtaining a first Hall Effect voltage using a first intermediate inner contact accessible at the first surface and located between the first endmost inner contact and a second end portion of the first doped well while applying the first current to the first endmost inner contact wherein the second end portion is opposite the first end portion; and applying a first voltage to a first electrode positioned on the first surface immediately adjacent to the first endmost inner contact and the first intermediate inner contact, the first electrode electrically isolated from the first doped well, while applying the first current to the first endmost inner contact and obtaining the first Hall Effect voltage, wherein:

obtaining the first Hall Effect voltage comprises obtaining the first Hall Effect voltage using a second intermediate inner contact accessible at the first surface and located between the first intermediate contact and the second end portion of the first doped well while applying the first current to the first endmost inner contact the method further comprising:

applying a third voltage to a third electrode positioned on the first surface immediately adjacent to the first intermediate inner contact and the second intermediate inner contact, the third electrode electrically isolated from the first doped well, while applying the first current to the first endmost inner contact and obtaining the first Hall Effect voltage, wherein applying the third voltage comprises applying a voltage to the third electrode which is different from the first voltage.

9. The method of claim 8, further comprising:
applying the first current to a third intermediate inner contact accessible at a second surface of a second sensor;
obtaining a second Hall Effect voltage using a second endmost inner contact accessible at the second surface and located at a third end portion of a second doped well in the second doped substrate extending along a second surface of the second doped substrate of the second sensor while applying the first current to the third intermediate inner contact; and
applying a second voltage to a second electrode positioned on the second surface immediately adjacent to the second endmost inner contact and the second intermediate inner contact, the second electrode electrically isolated from the second doped well, while applying the first current to the second endmost inner contact and obtaining the second Hall Effect voltage.

10. The method of claim 9, wherein applying the first voltage comprises applying the second voltage.

11. The method of claim 9, wherein applying the second voltage comprises applying a voltage to the second electrode which is different from the first voltage.

12. The method of claim 8, further comprising:
maintaining a first output voltage of the first sensor at 0 V by applying a first voltage gradient throughout the first sensor using the first electrode and the third electrode.

13. The method of claim 8, further comprising:
moving the sensor assembly through a "figure 8" pattern;
obtaining first sensor inputs from the first sensor as the sensor assembly is moved through the "figure 8" pattern;
determining a first sensor offset associated with the first sensor based upon the obtained first sensor inputs; and
determining the first voltage and the third voltage based upon the determined first sensor output.

* * * * *